United States Patent [19]
de Ferron et al.

[11] Patent Number: 4,835,423
[45] Date of Patent: May 30, 1989

[54] MOS TECHNOLOGY VOLTAGE SWITCH-OVER CIRCUIT

[75] Inventors: Gerard S. de Ferron, Fuveau; Serge Fruhauf, Peynier, both of France

[73] Assignee: Thomson Semiconducteurs, Paris, France

[21] Appl. No.: 122,445

[22] Filed: Nov. 19, 1987

[30] Foreign Application Priority Data

Nov. 21, 1986 [FR] France ................. 86 16256

[51] Int. Cl.$^4$ .................. H03K 17/687; H03K 5/153; G11C 11/00
[52] U.S. Cl. .................. 307/584; 307/296.3; 307/448; 307/451; 307/279; 307/270; 365/154; 365/226
[58] Field of Search ............ 307/584, 572, 577, 579, 307/443, 448, 475, 451, 485, 279, 270, 296.3, 296.1; 365/154, 104, 206

[56] References Cited

U.S. PATENT DOCUMENTS

| | | | |
|---|---|---|---|
| 3,976,949 | 8/1976 | Hepworth et al. | 307/448 |
| 4,023,050 | 5/1977 | Fox et al. | 307/264 |
| 4,317,110 | 2/1982 | Hsu | 340/825.91 |
| 4,384,220 | 5/1983 | Segawa et al. | 307/450 |
| 4,463,273 | 7/1984 | Dingwall | 307/450 |
| 4,578,601 | 3/1986 | McAlister et al. | 307/579 |
| 4,584,491 | 4/1986 | Ulmer | 307/443 |
| 4,590,396 | 5/1986 | Koike | 307/443 |
| 4,697,101 | 9/1987 | Iwahashi et al. | 307/579 |

FOREIGN PATENT DOCUMENTS

| | | | |
|---|---|---|---|
| 31582 | of 1980 | European Pat. Off. | |
| 0115729 | 9/1980 | Japan | 307/296.3 |
| 0166832 | 10/1983 | Japan | 307/448 |

OTHER PUBLICATIONS

Patent Abstracts of Japan, vol. No. 5, No. 186 (E-84) (858), Nov. 25, 1981.
JP-A-56 111 320 (Nippon Denki K.K.) 03-09-1981.

Primary Examiner—Stanley D. Miller
Assistant Examiner—Huy Kim Mai
Attorney, Agent, or Firm—Oblon, Fisher, Spivak, McClelland & Maier

[57] ABSTRACT

A voltage switch-over circuit, depending on a switch-over signal, delivers either a first voltage Vpp or a second voltage Vcc at its output, the voltage Vpp being greater than the voltage Vcc. The said circuit consists of a first MOS transistor with one of its electrodes connected to the voltage Vcc and a set of two series-connected MOS transistors with one of their electrodes connected to the voltage Vpp and with their two gates connected together so as to create a floating node at the common point between the two MOS transistors, the other electrode of the first MOS transistor and the other electrode of the set of two MOS transistors being connected together, and the gates of the first MOS transistor and those of the set of two MOS transistors respectively receiving the switch-over signal and the reverse switch-over signal.

6 Claims, 1 Drawing Sheet

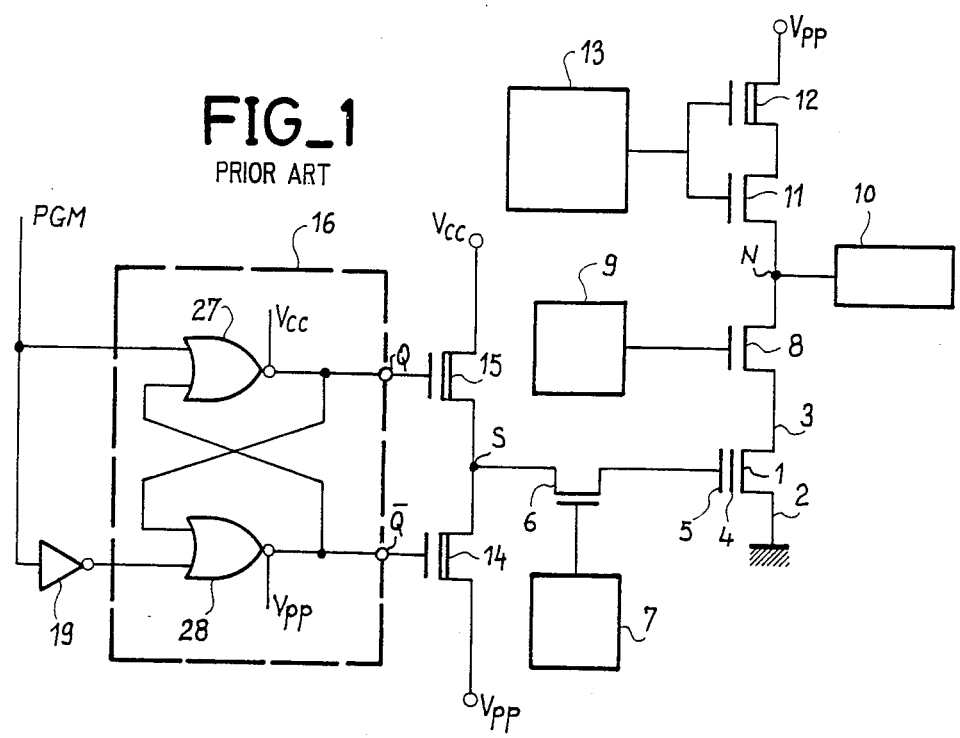
FIG_1
PRIOR ART
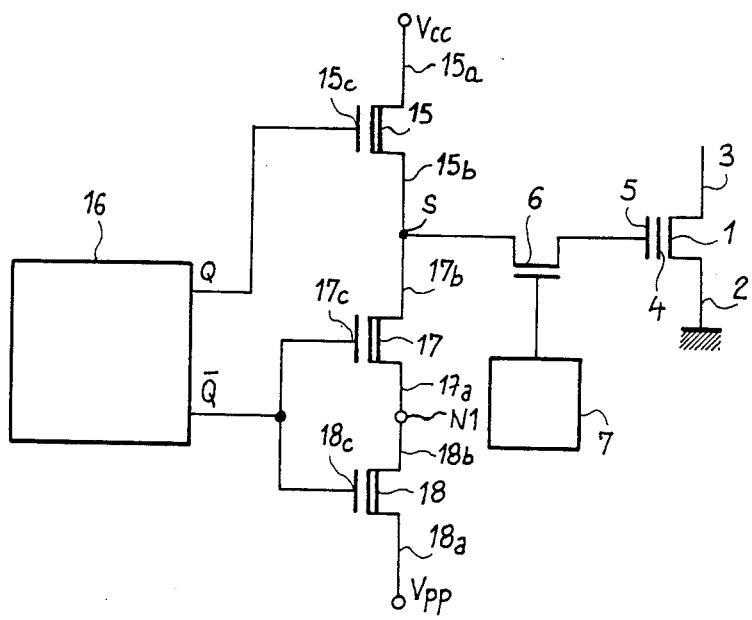
FIG_2

MOS TECHNOLOGY VOLTAGE SWITCH-OVER CIRCUIT

BACKGROUND OF THE INVENTION

1. 1. Field of the Invention

The present invention pertains to a voltage switch-over circuit in MOS technology. It pertains more particularly to a voltage switch-over circuit in MOS technology which, depending on a switch-over signal, delivers either a first voltage Vpp or a second voltage Vcc at its output, the voltage Vpp being greater than the voltage Vcc.

2. Description of the Prior Art

This type of switch-over circuit is used especially to program or read EPROM or EEPROM type memories, the memory cell of which is formed by a floating-gate MOS transistor. Thus, as shown in FIG. 1 which pertains to an EPROM memory, the memory cell 1 of which consists of a SAMOS (stacked gate avalanche injection MOS) type floating-gate transistor, each floating-gate transistor 1 has two main electrodes, 2 and 3 respectively, and a control gate 5 stacked on the floating gate 4. In the case of a memory, the floating-gate transistors 1 which constitute the memory cells are connected in matrix form. Thus, a first main electrode 2 or source, in the technology used, is connected to the ground while the other electrode 3 or drain is connected by a bit line (not shown) and a MOS transistor forming a switch 8 to a column address decoder 9. The control gate 5 is connected by another connection, called a word line (not shown), to a row address decoder 7.

More specifically, the column address decoder 9 is connected to the gate of the transistor 8, which has its source connected to the electrode 3 of the floating-gate MOS transistor 1 while its other electrode or drain is connected by a load line, consisting of the MOS transistors 11 and 12, to the programming voltage Vpp. The load line consists of a depleted MOS transistor 12 which has its drain connected to Vpp and its source connected to the drain of an enhanced MOS transistor 11, the two gates of the transistors 11 and 12 being connected to each other and to the write control circuit 13. Furthermore, the node N between the MOS transistor 11 and the drain of the MOS transistor 8 is connected to a read amplifier represented by the block 10.

Similarly, the row address decoder 7 is connected to the gate of the switch MOS transistor 6 which has one of its main electrodes connected to the control gate 5 of the floating-gate MOS transistor 1 while its other main electrode is connected to the output of a voltage switch-over circuit.

As shown in FIG. 1 the voltage switch-over circuit, which is used to switch over the voltage at the output S either to the voltage Vpp or to the voltage Vcc, consists essentially of two depleted MOS transistors 14 and 15, mounted between the supply voltage Vcc and the programming voltage Vpp. More specifically, the drain of the depleted transistor 14 is connected to Vpp. Its source is connected to the source of the depleted transistor 15 wich has its drain connected to the voltage Vcc. The output of the switch-over circuit is made at the midpoint S between the two depleted MOS transistors 14 and 15. Furthermore, the gates of the two depleted transistors 14 and 15 are respectively connected to the outputs Q and $\bar{Q}$ of an RS flip-flop 16. This flip-flop 16 is made, for example, by means of two cross-coupled NOR gates 27 and 28, i.e. one of the inputs of the NOR gate 27 is connected to the output of the NOR gate 28, and one of the inputs of the NOR gate 28 is connected to the output of the NOR gate 27. Furthermore, the NOR gate 27 is supplied by the supply voltage Vcc while the NOR gate 28 is supplied by the programming voltage Vpp. The other inputs of the NOR gates 27 and 28 are respectively connected to the programming control signal PGM and the inverted programming control signal $\overline{PGM}$ obtained at the output of the inverter 19.

To read a memory cell of the type shown in FIG. 1, a voltage equal to the supply voltage Vcc should be applied to the control gate 5. This voltage comes from the switch-over circuit. Consequently, the signal at the output S is at the voltage Vcc. Now the supply voltage Vcc is generally chosen as being equal to 5 volts while the programming voltage Vpp is most usually equal to 21 volts in the technology used, but must bear voltages equal to at least 23 volts. The result of this is that the voltage strength of the MOS transistor 14 should be equal to at least Vpp-Vcc, i.e. it should be greater than 18 volts. Now, with currently used technologies, it is difficult to make MOS transistors having this degree of voltage strength. Consequently, a problem of breakdown is frequently observed, and this problem makes the switch-over circuit unusable.

An object of the present invention, therefore, is to remove this disadvantage by proposing a new voltage switch-over circuit in MOS technology.

3. Summary of the Invention

Thus, an object of the present invention is a voltage switch-over circuit in MOC technology which, depending on a switch-over signal, delivers either a first voltage Vpp or a second voltage Vcc at its output, the voltage Vpp being greater than the voltage Vcc, the said circuit comprising a first MOS transistor having one of its electrodes connected to the voltage Vcc and a set of two series-connected MOS transistors which has one of its electrodes connected to the voltage Vpp and has its two gates connected together, so as to create a floating node at the common point between the two MOS transistors, the other electrode of the first MOS transistor and the other similar electrode of the set of two MOS transistors being connected together, and the gates of the first MOS transistoor and those of the set of two MOS transistors respectively receiving the switch-over signal and the reserved switch-over signal.

BRIEF DESCRIPTION OF THE DRAWINGS

Other characteristics and advantages of the present invention will emerge from the following description of an embodiment, made with reference to the appended drawings, of which,:

FIG. 1, already described, is a prior art schematic drawing of an electrically programmable non-volatile memory comprising a voltage switch-over circuit;

FIG. 2 is a schematic drawing of an embodiment of the voltage switch-over circuit according to the present invention.

To simplify the description, the same elements have the same references in the figures. Furthermore, the description has been made with reference to an NMOS technology and to a switch-over circuit made by means of depleted MOS transistors. However, it is obvious to the specialist that the present invention can be made using other technologies and other types of MOS transistors, in particular enhanced MOS transistors.

DESCRIPTION OF A PREFERRED EMBODIMENT

As shown in FIG. 2, the voltage switch-over circuit according to the present invention comprises, instead of the depleted MOS transistor 14 connected to the voltage Vpp, a set of two depleted MOS transistors 17 and 18. More specifically, the switch-over circuit of the present invention comprises the set of two MOS transistors 18 and 17 which are series-connected, with the electrode 18a or drain of the MOS transistor 18 connected to the programming voltage Vpp and a depleted MOS transistor 15. The electrode 15a or drain of the said depleted MOS transistor 15 is connected to the supply voltage Vcc and the other electrode 15b or source of the said depleted MOS transistor 15 is connected to the electrode 17b or source of the depleted MOS transistor 17. Furthermore, the drain 17a of the transistor 17 is connected to the source 18b of the MOS transistor 18 by providing a floating node N1, because the gates 17c and 18c of the set of two MOS transistors are connected together. Moreover, the gates 17c and 18c are connected to the output $\bar{Q}$ of the flip-flop 16 while the gate 15c of the MOS transistor 15 is connected to the output Q of the flip-flop 16. In a known way, the output S of the switch-over circuit is connected by a switch MOS transistor 6, controlled by the row address decoder 7, to the control gate 5 of a floating-gate MOS transistor 1 which constitutes a memory cell of an EPROM memory for example.

The following explanation of the working of the switch-over circuit according to the present invention will also serve to show its advantages. Thus, in read mode, the output Q of the RS flip-flop is positioned at the logic level "1". Consequently, the depleted MOS transistor 15 is on and the voltage at the point S is positioned at Vcc. Consequently, the set of two depleted MOS transistors 18 and 17 should have a voltage strength equal to at least Vpp-Vcc. Now, since the node N1 between the two transistors 18 and 17 is a floating node, the voltage at this node is automatically adjusted to Vpp—the breakdown voltage of the MOS transistor 18. Similarly, the voltage at the node N1 may be equal to Vcc+ the breakdown voltage of the depleted MOS transistor 17. Consequently, the switch-over circuit thus made makes it possible to raise the breakdown voltage of the entire device. For, with the above circuit, Vpp can be equal to Vcc+ wo breakdown voltages.

Another advantage of the switch-over circuit of the present invention lies in the fact that is pushes back the breakdown voltage point and, hence, increases the value of Vpp by making use of the following phenomenon: during breakdown the charges trapped in the oxide are replaced by electrons which will make the unwanted NPN transistor conductive, so that the said transistor goes into negative resistance. The same phenomenon is undergone by the transistor 18 with the circuit of the present invention, since the source of the said transistor is floating. However, in this case, the source 18b picks up the electrons and therefore does not make the unwanted transistor conductive. Since the transistor 18 does not break down, the above-described phenomenon can be used to advantage.

According to another characteristic of the present invention, the two MOS transistors 17 and 18 may have identical or different W/L ratios. Furthermore, to obtain a switch-over circuit with the same characteristics as the switch-over circuit of FIG. 1, the MOS transistors 17 and 18 must have an area which is about twice the area of the MOS transistor 14.

Similarly, the MOS transistors 15, 17 and 18 may be of the same type as in the embodiment, whether shown or not.

What is claimed is:

1. A voltage sensitive switch-over circuit, comprising:
   a first MOS transistor connected to a supply voltage Vcc and connected to the circuit output S;
   a second MOS transistor connected to the circuit output S, said second MOS transistor having a gate;
   a third MOS transistor connected serially with said second MOS transistor and forming a floating node, said third MOS transistor connected to a programming voltage Vpp, the programming voltage Vpp being greater than the supply voltage Vcc, said third MOS transistor having a gate connected to the gate of said second MOS transistor;
   a switch-over signal and a reversed switch-over signal alternatively being received by the gate of said first MOS transistor and by the gate of said second MOS transistor; and said output S alternatively receiving the supply voltage Vcc and the programming voltage Vpp.

2. A voltage sensitive switch-over circuit according to claim 1, wherein:
   the programming voltage Vpp is equal to a summation of the supply voltage Vcc, a breakdown voltage of said second MOS transistor and a breakdown voltage of said third MOS transistor.

3. A voltage sensitive switch-over circuit according to claim 1, wherein:
   said first MOS transistor, said second MOS transistor and said third MOS transistor are of the same type.

4. A voltage sensitive switch-over circuit according to claim 1, wherein:
   said first MOS transistor, said second MOS transistor and said third MOS transistor are of different types.

5. A voltage sensitive switch-over circuit according to claim 1, wherein:
   said second MOS transistor and said third MOS transistor have identical W/L ratios.

6. A voltage sensitive switch-over circuit according to claim 1, wherein:
   said second MOS transistor and said third MOS transistor have different W/L ratios.

* * * * *